United States Patent [19]
Partow

[11] Patent Number: 5,457,434
[45] Date of Patent: Oct. 10, 1995

[54] INTEGRATED CIRCUIT OSCILLATOR WITH HIGH VOLTAGE FEEDBACK NETWORK

[75] Inventor: Tony S. Partow, Colorado Springs, Colo.

[73] Assignees: AT&T Global Information Solutions Company, Dayton, Ohio; Hyundai Electronics America, Milpitas, Calif.

[21] Appl. No.: 221,346

[22] Filed: Mar. 31, 1994

[51] Int. Cl.⁶ .................................................... H03B 5/12
[52] U.S. Cl. ...................... 331/117 FE; 331/68; 331/74; 331/108 C; 331/DIG. 3; 345/179
[58] Field of Search .............................. 331/62, 65, 68, 331/74, 116 R, 116 PE, 117 R, 117 FE, 117 D, 108 A, 108 C, 158, 160, 177 V, DIG. 3; 345/157, 179

[56] References Cited

U.S. PATENT DOCUMENTS

| | | | |
|---|---|---|---|
| 3,763,479 | 10/1973 | Jebb et al. | 340/172.5 |
| 3,868,597 | 2/1975 | Gollinger | 331/116 FE |
| 3,878,481 | 4/1975 | Healey, III | 331/105 |
| 4,003,000 | 1/1977 | Sordello et al. | 331/117 R |
| 4,227,044 | 10/1980 | Fencl | 178/19 |
| 4,319,209 | 3/1982 | Hara | 334/74 |
| 4,378,532 | 3/1983 | Burgoon | 331/158 |
| 4,475,235 | 10/1984 | Graham | 382/3 |
| 4,593,255 | 6/1986 | Matsuura | 331/117 R |
| 4,672,154 | 6/1987 | Rodgers et al. | 178/19 |
| 4,745,376 | 5/1988 | Aleksa et al. | 331/162 |
| 4,927,986 | 5/1990 | Daly | 178/18 |
| 5,027,115 | 6/1991 | Sato et al. | 341/13 |
| 5,027,414 | 6/1991 | Hilton | 382/3 |
| 5,030,926 | 7/1991 | Walden | 331/116 |
| 5,107,541 | 4/1992 | Hilton | 382/3 |
| 5,136,263 | 8/1992 | Lane | 331/158 |
| 5,142,251 | 8/1992 | Boomer | 331/116 |
| 5,144,264 | 9/1992 | Chong et al. | 331/117 |
| 5,150,081 | 9/1992 | Goldberg | 331/109 |
| 5,159,321 | 10/1992 | Masaki et al. | 340/706 |
| 5,181,521 | 1/1993 | Lemelson | 128/736 |
| 5,225,637 | 7/1993 | Rodgers et al. | 178/19 |
| 5,226,091 | 7/1993 | Howell et al. | 382/3 |
| 5,227,622 | 7/1993 | Suzuki | 250/221 |
| 5,247,137 | 9/1993 | Epperson | 178/18 |
| 5,278,545 | 1/1994 | Streck | 345/102 |
| 5,290,972 | 3/1994 | Someya et al. | 178/18 |
| 5,291,213 | 3/1994 | Krauss | 345/179 |
| 5,294,792 | 3/1994 | Lewis et al. | 250/221 |

FOREIGN PATENT DOCUMENTS 2647219  12/1977  Germany .......................... 331/116 FE

OTHER PUBLICATIONS

Sedra, A. S.; "Microelectronic Circuits"; Saunders College Publishing Harcourt Brace College Publishers; no month, 1991; pp. 855–860.

*Primary Examiner*—David Mis
*Attorney, Agent, or Firm*—Wayne P. Bailey

[57] ABSTRACT

An oscillator circuit having an amplifier and feedback loop multiplies a generated signal by appropriate selection of capacitance ratios in the feedback loop. In order to isolate this multiplied, high voltage signal, a voltage divider is used to isolate the high voltage portion from the input and output (I/O) of an integrated circuit oscillator core. The multiplied voltage creates a high voltage signal suitable for stylus signal transmission. The divided, and relatively low, voltage is used in the feedback path to stabilize the oscillator core's operation.

21 Claims, 5 Drawing Sheets

INTEGRATED CIRCUIT OSCILLATOR WITH HIGH VOLTAGE FEEDBACK NETWORK

TECHNICAL FIELD

The present invention relates to an electronic circuit, and more particularly to a high voltage electronic oscillator circuit.

BACKGROUND OF THE INVENTION

Position responsive electrographic apparatus which use electrostatic technology, such as pen based computers and digitizers, require the generation of a large AC signal from a stylus transmitter device for detection by a receiver/controller. These position responsive electrographic apparatus are commonly known in the art, as exemplified by U.S. Pat. No. 5,225,637 entitled "Position Resolving System", U.S. Pat. No. 5,247,137 entitled "Autonomous Computer Input Device and Marking Instrument", and U.S. Pat. No. 4,672,154 entitled "Low Power, High Resolution Digitizing System with Cordless Pen/Mouse", all three of which are hereby incorporated by reference.

In portable applications, where weight, size and cost are of crucial importance, the stylus device generally needs to run off of low-cost, low-capacity, low-voltage and commercially available batteries. Since the coupling between the stylus transmitter and the receiver/controller circuit is weak, the AC signal required from the stylus is much larger than the supply voltage provided by the batteries. Therefore, an electronic means of amplifying the signal beyond that of the supply voltage is required.

Prior techniques for generating such amplified signals have used discrete circuitry containing numerous discrete components. These discrete component circuits suffer from high power dissipation and large component sizes, and thus limit the ability to reduce the size and weight of, and power dissipation within, the stylus.

SUMMARY OF THE INVENTION

It is an object of the present invention to generate a high voltage electrical signal.

It is another object of the present invention to generate a high voltage electrical signal with reduced power consumption.

It is yet another object of the present invention to generate an electrical signal with a magnitude several times that of the supply voltage, while dissipating significantly lower power than alternative methods available today.

It is a further object of the present invention to generate a high voltage AC signal in a manner that allows for circuit integration on a semiconductor substrate.

It is yet a further object of the present invention to provide a circuit that generates a high voltage AC signal in a manner that allows for circuit integration within a stylus of an electrographic device.

An oscillator circuit having an amplifier and feedback loop multiplies a generated signal by appropriate selection of capacitance ratios in the feedback loop. In order to isolate this multiplied, high voltage signal, a voltage divider is used to isolate the high voltage portion from the input and output (I/O) of an integrated circuit oscillator core. The multiplied voltage creates a high voltage signal suitable for stylus signal transmission. The divided, and relatively low, voltage is used in the feedback path to stabilize the oscillator core's operation.

DETAILED DESCRIPTION OF THE PREFERRED EMBODIMENT

Figure 1:
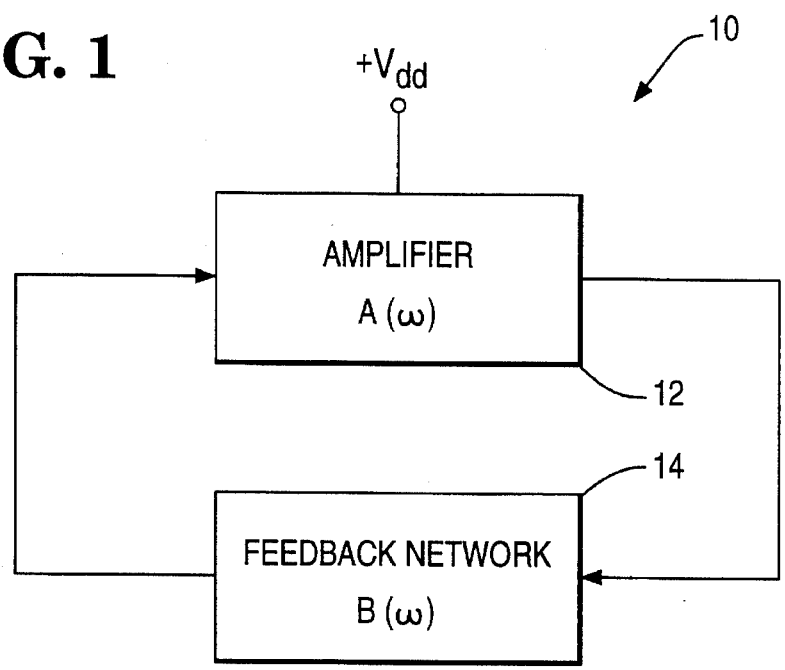
FIG. 1 is a traditional oscillator block diagram.

FIG. 1 shows the basic blocks required in building an electronic oscillator 10. The feedback network $B(\omega)$ 14, generally a passive network/circuit consisting of capacitors, inductors and/or piezoelectric resonators (i.e. Quartz crystal, Ceramic resonators, etc.), generates a phase shift of 180 degrees at a specific frequency '$\omega_0$'. The amplifier block $A(\omega)$ 12 provides gain to overcome losses in the feedback network 14. The amplifier block 12 also provides an additional 180 degrees of phase shift. The Barkhausen criterion states that oscillations at frequency '$\omega_0$'0 will start if (i) the total phase shift around the feedback loop is 0 or an integer multiple of 360 degrees, and (ii) the loop gain is greater than or equal to 1, at that frequency. The Barkhausen criterion is further described in "Microelectronic Circuits", by Adel S. Sedra and Kenneth C. Smith, which is hereby incorporated by reference as background material.

Figure 2:
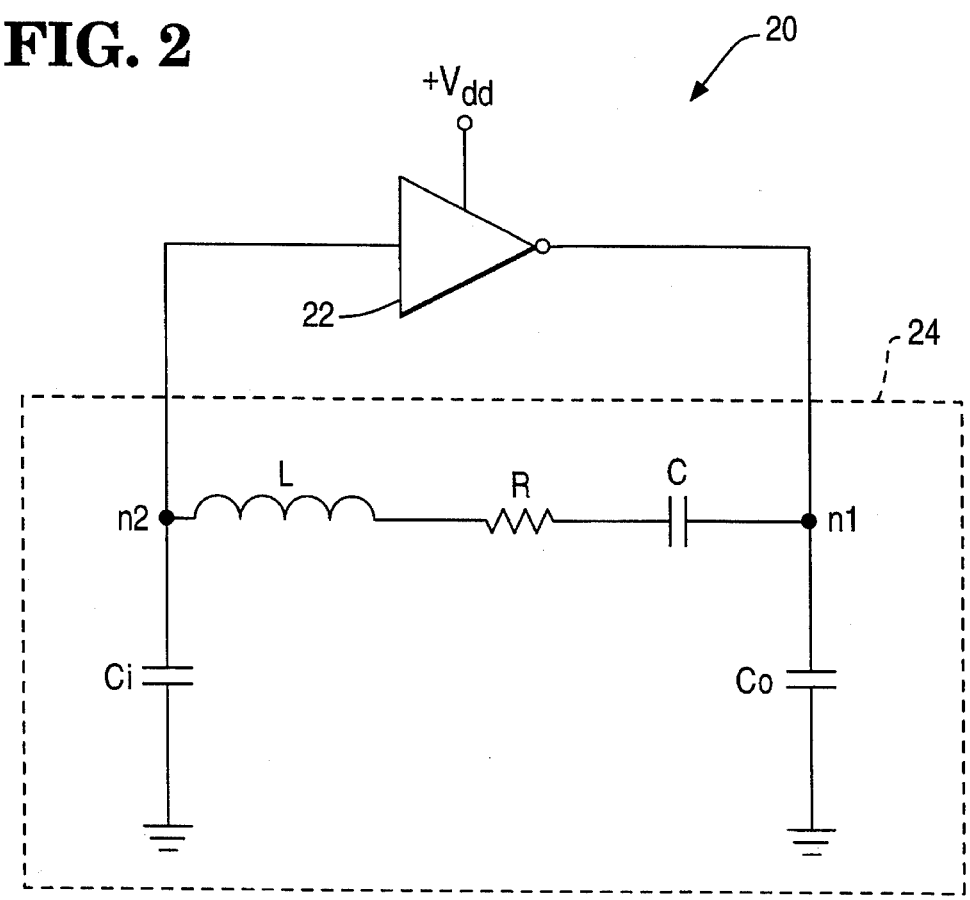
FIG. 2 is a schematic of a Pierce oscillator circuit.

FIG. 2 shows a Pierce oscillator 20 implementation of an electronic oscillator. An inverting amplifier 22 is coupled to a passive feedback network 24. The oscillation frequency $\omega$ is determined by the feedback network, which consists of L, R, C, Ci and Co, and is given by:

$$\omega = \frac{1}{\sqrt{L \cdot C_{eq}}}$$

where $$C_{eq} = \frac{ci \cdot co \cdot c}{ci \cdot co + ci \cdot c + co \cdot c}$$

The transfer function of this feedback network at resonance frequency from node n2 to node n1 is derived to be:

$$B(co) = \frac{1}{L \cdot ci \cdot \left[ -\omega^2 + j \cdot \omega \cdot \frac{R}{L} + \frac{1}{L} \cdot \left( \frac{1}{c} + \frac{1}{ci} \right) \right]}$$

Figure 3:
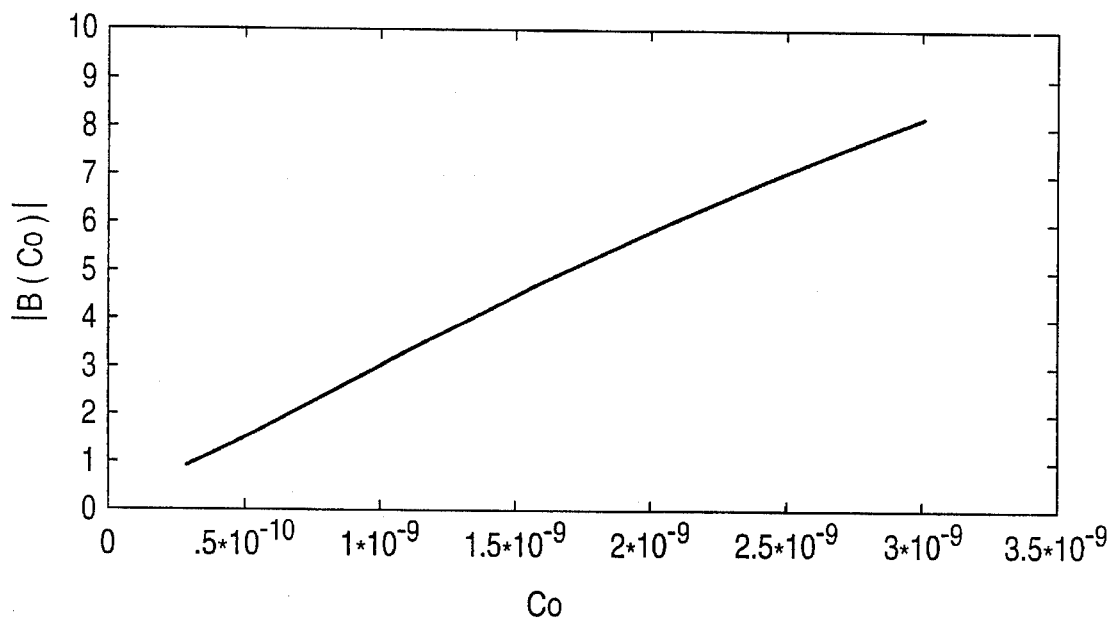
FIG. 3 is a graph showing the magnitude of a feedback transfer function for different output capacitance values.

FIG. 3 is a plot of the magnitude of the feedback network transfer function vs. Co for specific values of L, R, C and Ci. It can be seen that as the value of Co is increased beyond that of Ci, |B(Co)| becomes greater than 1 and proportional to Co/Ci. Therefore, a voltage gain or amplification can be realized by selecting Co larger than Ci. This allows for the generation of voltages larger than the supply voltage Vdd of oscillator 22.

In applications where component/circuit sizes are critical, integration of an oscillator core (amplifier) with the rest of the circuits onto a piece of silicon is vital. The circuit of FIG. 2 is realizable using discrete components, but it is not appropriate for such integration. In most integrated circuit processes, and particularly in CMOS ICs, the I/O pads interfacing the integrated circuit to the external electronics are protected from voltages greater than the supply voltage via electrostatic discharge (ESD) protection clamping mechanisms known in the art. Therefore, it isn't possible to generate voltages greater than the supply voltage on such an integrated circuit, and then provide this high voltage external to the IC, due to the ESD clamping mechanism. This is because the voltages on the I/O pads are clamped such that the voltage on the I/O pads cannot exceed a particular voltage. For CMOS ICs, the voltages are clamped so that the pad(s) cannot exceed Vdd+0.5 volts, or go below Vss−0.5 volts. Even if these ESD clamping structures were absent, the high voltage can over-stress the IC and result in permanent damage.

To allow integration of an oscillator core on the same integrated circuit as the rest of the electronics, a modified Pierce oscillator is used. This modified Pierce oscillator circuit is illustrated at 30 in FIG. 4. Capacitor Ci has been replaced with 2 capacitors, C1 and C2. The series connection of C1 and C2 forms a capacitive voltage divider isolating the integrated oscillator core 32 from the high voltage node n2. By choosing the value of C2 comparable to Co, the voltage gain from node n2 to node n1 can be maintained at 1 or less; while choosing C1 smaller than Co results in a voltage gain proportional to Co/C12, where C12 is the equivalent capacitance of C1 in series with C2.

Figure 4:
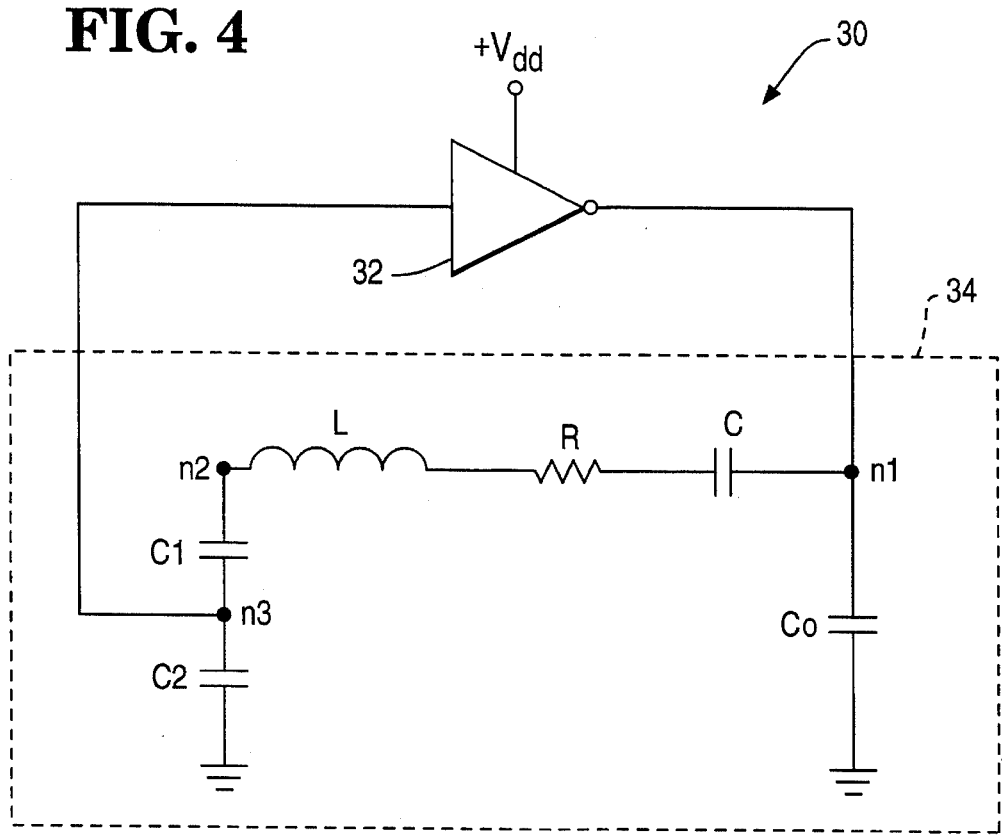
FIG. 4 is a schematic of a modified Pierce oscillator.
Figure 5:
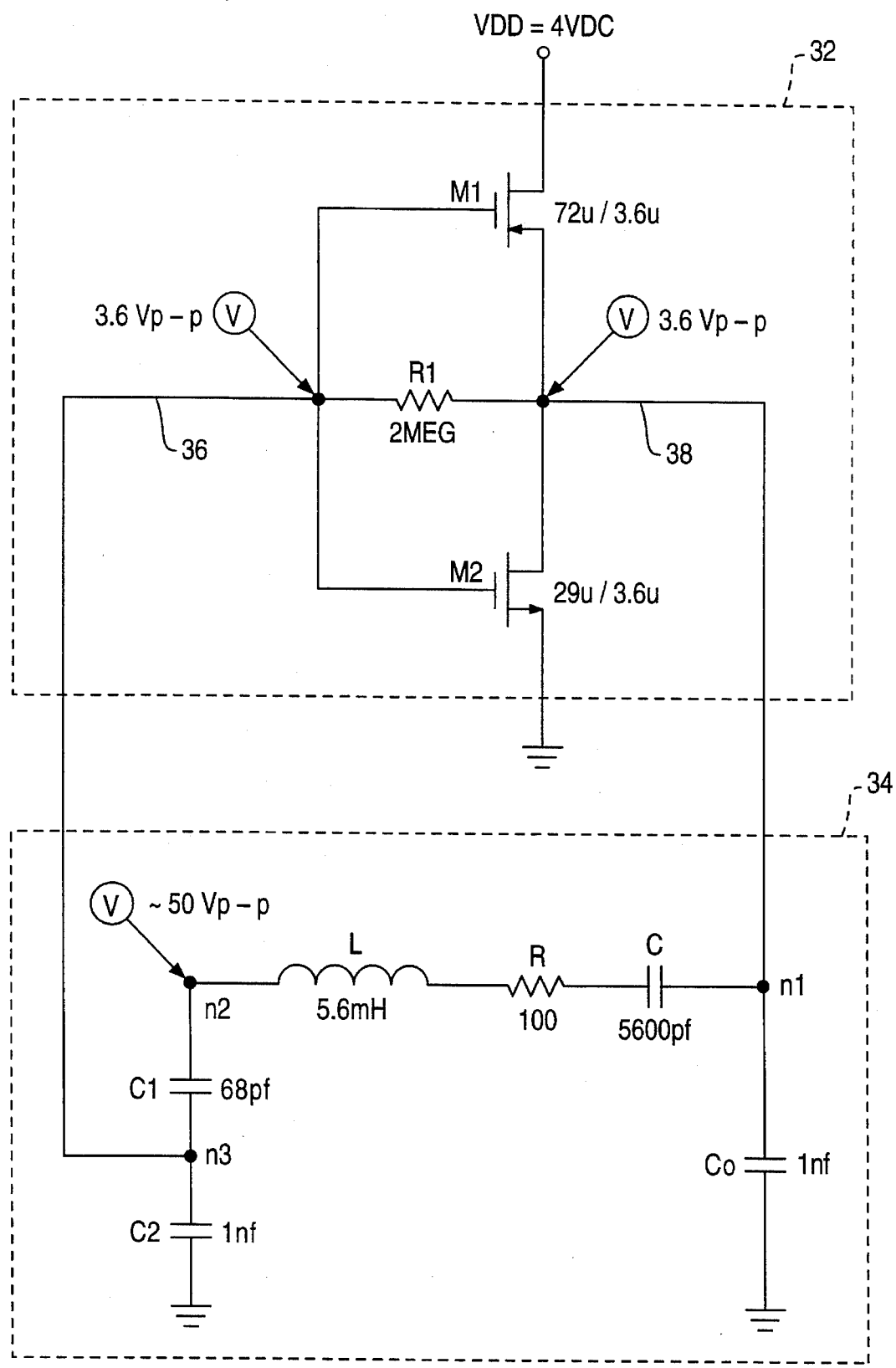
FIG. 5 is a schematic of a modified Pierce oscillator with specific component values.

FIG. 5 shows the preferred embodiment for the logical circuit representation of FIG. 4. For this circuit, the following CMOS process nominal parameters were used:

Oxide Capacitance=$2^{e-7}$F/cm$^2$

N–Channel Threshold=0.76 V

P–Channel Threshold=−0.79 V

N+mobility=590 cm$^2$/V−sec

P+mobility=250 cm$^2$/V−sec

The inverting amplifier 32 is comprised of two FETs, M1 and M2, which have their gates commonly connected at the input 36 of amplifier 32. The drain of M1 is connected to the source of M2 at the output 38 of amplifier 32. A 2 meg resistor R1 is attached between the input 36 and output 38 of amplifier 32. The source of M1 is attached to +Vdd, which is preferably 4 volts. The drain of M2 is attached to 0 volts, or ground. M1 is a p-channel enhancement FET, having a channel width of 72 u and channel length of 3.6 u, whereas M2 is an n-channel enhancement FET, having a channel width of 29u and a channel length of 3.6u.

As further shown in FIG. 5, the input voltage at 36 and the output voltage at 38 are each at approximately 3.6 volts p-p (peak-to-peak AC voltage). The output voltage swings within a couple of hundred millivolts of the supply voltage rails. When the input voltage approaches the Vdd rail, M1 drops out of saturation. Similarly, when the input voltage approaches the ground rail, M2 drops out of saturation. This happens so that the loop gain is maintained at 1. Therefore, since the supply voltage is 4.0 volts, the output voltage swings roughly to 3.6 volts (this output voltage of 3.6 volts p-p similarly appears at node n1 of FIG. 4). The voltage-swing at input 36 is roughly the same, because Co/C2 is chosen to be 1, as will be further described below.

Continuing with the passive feedback network 34 depicted in FIG. 5, the preferred component values for C1, C2, C, Co, L and R (which is the winding resistance value of L) are shown in such Figure. By choosing these component values, the following voltages are generated at nodes n2 and n3.

$$V(n2) \approx V(n1) * \left( \frac{Co}{C1} \right)$$

$$V(n2) \approx (3.6\ Vp-p) * \left( \frac{1nf}{68pf} \right) \approx 52\ Vp-p$$

$$V(n3) \approx V(n1) * \left( \frac{Co}{C2} \right)$$

$$V(n3) \approx (3.6\ Vp-p) * \left( \frac{1nf}{1nf} \right) \approx 3.6\ Vp-p$$

Since the voltages on nodes n3 and n1 are less than the supply voltage Vdd, it is possible to manufacture the oscillator core 32 as a traditional integrated circuit, as the ESD clamping techniques will no longer inhibit the overall circuit operation. This is possible since the high voltage node n2 is isolated from the low voltage node n3 by the series connection of capacitors C1 and C2, which forms an AC voltage divider. Therefore, nodes n3 and n1 can attach to I/O pads of an integrated circuit containing oscillator core 32, without detrimental impact by ESD protection mechanisms. The remaining components Co, C1, C2, L and C3 are still maintained as discrete components (Note that R represents the inherent resistance of the inductor L's winding). As can be seen, the peak-to-peak voltage of node n2 is approximately 52 volts, which exceeds the supply voltage of 4 volts. The high voltage signal on node n2 connects to the tip of a stylus, for use in electrostatically coupling the stylus to a receiver/controller within an electrographic apparatus such as a digitizing tablet or pen computer.

Figure 6:
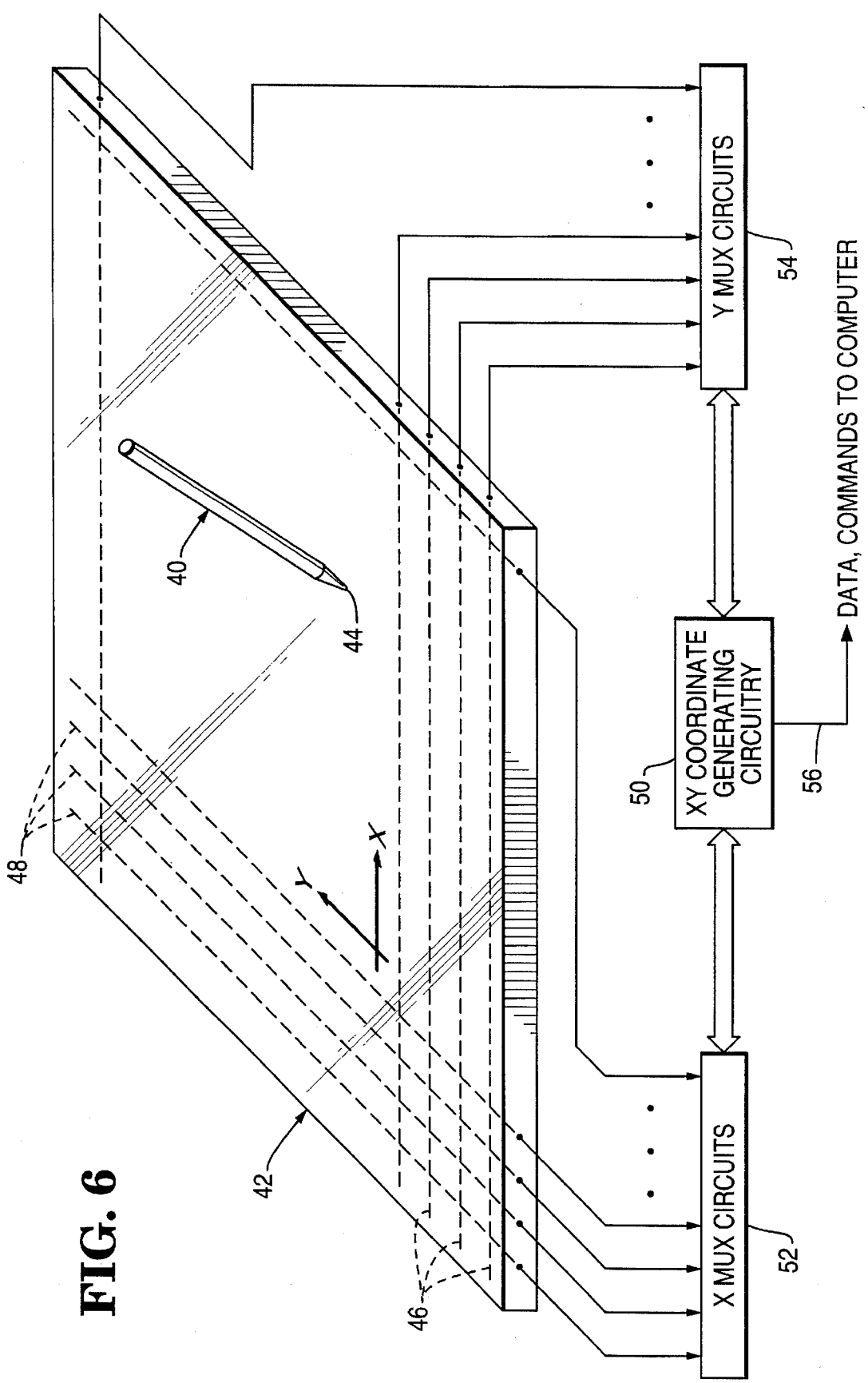
FIG. 6 shows a typical position responsive electrographic apparatus.

Referring now to FIG. 6, a stylus 40 in close proximity to a position responsive electrographic apparatus 42 is shown. The stylus has a tip 44 from which the high voltage AC signal radiates from. This AC signal is coupled to the position responsive electrographic apparatus 42. X and Y conductors 46 and 48 within the electrographic apparatus receive the radiated AC signal. XY coordinate generating circuitry 50, commonly known in the art, determines the location of stylus 40 by selectively enabling X and Y multiplexor circuits 52 and 54. An interface 56 to a computer is provided to pass data and commands. For a stand alone pen computer, this computer is physically housed within the electrographic apparatus.

Figure 7:
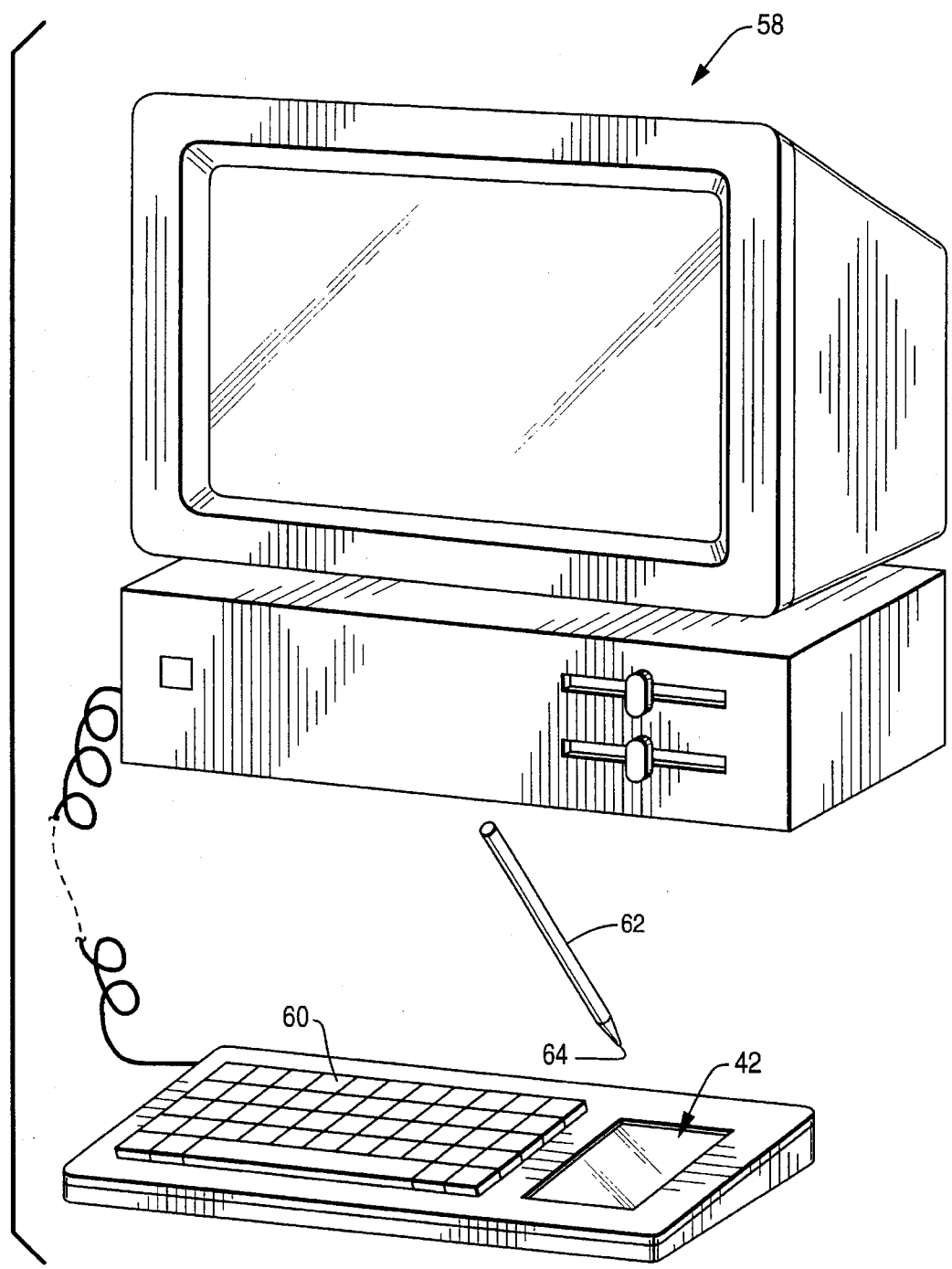
FIG. 7 shows an alternate embodiment for a position responsive electrographic apparatus embedded within a keyboard housing and attached to a computer.

FIG. 7 shows an alternate embodiment for the electrographic apparatus 42 wherein such apparatus is contained within a traditional keyboard 60 of a computer system 58. FIG. 7 also shows the use of a pen 62 having a tip 64 as a stylus. This tip 64 radiates the high voltage AC signal as described hereinabove.

While the present invention has been described and illustrated in detail, it is understood that the same is by way of illustration and example only, and is not to be taken as a limitation, the spirit and scope of the present invention being limited only by the terms of the appended claims.

I claim:

1. An oscillator circuit comprising:

an amplifier having an input and output; and a feedback network, operatively coupled to said amplifier, comprising means for generating an internal voltage greater than a voltage at said input and output, wherein said internal voltage is coupled to a position responsive electrographic apparatus.

2. The oscillator circuit of claim 1 wherein said internal voltage is greater than a supply voltage for said amplifier.

3. The oscillator circuit of claim 1 wherein said amplifier is disposed on a semiconductor substrate.

4. An oscillator circuit comprising:

an amplifier; and a feedback network, having an output node and internal node and operatively coupled to said amplifier, comprising means for generating a voltage on said internal node that is greater than a voltage on said output node, wherein said internal node voltage is coupled to a position responsive electrographic apparatus.

5. The oscillator circuit of claim 4 wherein said feedback network comprises an input capacitor and an output capacitor, and wherein the capacitance of said output capacitor is greater than the capacitance of said input capacitor.

6. The oscillator circuit of claim 4 wherein said internal node voltage is greater than a supply voltage for said amplifier.

7. The oscillator circuit of claim 4 wherein said amplifier is disposed on a semiconductor substrate.

8. An oscillator circuit, comprising:

an oscillator core having an input node and an output node; and a feedback network coupled between said input node and output node, said feedback network having at least one internal node and comprising voltage divider means for dividing a voltage such that a voltage on said input node is less than a voltage on said at least one internal node, wherein said internal node voltage is coupled to a position responsive electrographic apparatus.

9. The oscillator circuit of claim 8 further comprising means for generating a voltage on said output node that is less than said voltage on said at least one internal node.

10. An oscillator circuit, comprising:

an oscillator core having an input node and an output node; and a feedback network coupled between said input node and said output node, and comprising (i) an input capacitor coupled between said input node and ground and (ii) an isolation capacitor coupled between said input node and a high voltage node, wherein a voltage on said high voltage node is coupled to a position responsive electrographic apparatus.

11. The oscillator circuit of claim 10 wherein said input capacitor and isolation capacitor form a voltage divider.

12. The circuit of claim 10 wherein said feedback network further comprises a first capacitor having a first and second node, an inductor coupled between said high voltage node and said first node, and an output capacitor coupled between said second node and ground.

13. The circuit of claim 10 wherein said oscillator core is disposed on a semiconductor substrate.

14. A circuit comprising an oscillator core having an input node and an output node, and a feedback network coupled between said input and output node, said feedback network comprising:

an input capacitor coupled between said input node and ground;

an output capacitor coupled between said output node and ground;

an isolation capacitor coupled to said input node and a first node of an inductor; and a first capacitor coupled between a second node of said inductor and said output node of said oscillator, wherein a voltage on said first node is coupled to a position responsive electrographic apparatus.

15. The circuit of claim 14 wherein said oscillator core is disposed on a semiconductor substrate.

16. The circuit of claim 14 wherein said output capacitor capacitance is greater than said input capacitor capacitance.

17. A method for generating a high voltage signal in an oscillator circuit comprising an amplifier circuit and a feedback circuit, said method comprising the steps of:

generating an amplifier circuit output voltage;

generating a feedback circuit internal voltage greater than said amplifier circuit output voltage;

generating a feedback circuit output voltage less than said feedback circuit internal voltage; and coupling said feedback circuit internal voltage to a position responsive electrographic apparatus.

18. An electronic stylus, comprising:

a body;

an integrated circuit, within said body, comprising an oscillator circuit for generating an AC signal; and a voltage supply having an output voltage coupled to said integrated circuit, wherein the peak to peak voltage of said AC signal exceeds said output voltage.

19. The stylus of claim 18 wherein said AC signal is transmitted through a tip of said stylus.

20. An electronic stylus, comprising:

a body; and an integrated circuit, within said body, comprising an oscillator circuit for generating an AC signal, wherein said oscillator circuit comprises:

an amplifier having an input and output; and a feedback network, operatively coupled to said amplifier, comprising means for generating an internal voltage greater than a voltage at said input and output.

21. An electronic stylus, comprising:

a body having a tip portion for transmitting an AC signal;

an integrated circuit, within said body, comprising an oscillator circuit for generating said AC signal; and a voltage supply coupled to said integrated circuit, wherein peak-to-peak voltage of said AC signal exceeds said voltage supply voltage.

* * * * *